(12) United States Patent  
Chen

(10) Patent No.: US 8,715,418 B2  
(45) Date of Patent: May 6, 2014

(54) SEMICONDUCTOR PROCESSING SYSTEM; A SEMICONDUCTOR PROCESSING CHAMBER; AND A METHOD FOR LOADING, UNLOADING AND EXCHANGING SEMICONDUCTOR WORK PIECES FROM A SEMICONDUCTOR PROCESSING CHAMBER

(75) Inventor: AiHua Chen, Shanghai (CN)

(73) Assignee: Advanced Micro-Fabrication Equipment, Inc. Asia, George Town, Grand Cayman (KY)

( * ) Notice: Subject to any disclaimer, the term of this patent is extended or adjusted under 35 U.S.C. 154(b) by 1907 days.

(21) Appl. No.: 11/440,747

(22) Filed: May 24, 2006

(65) Prior Publication Data

US 2007/0031236 A1    Feb. 8, 2007

(30) Foreign Application Priority Data

Aug. 5, 2005 (CN) .......................... 2005 1 0028562

(51) Int. Cl.  
*C23C 16/00* (2006.01)  
*H01L 21/68* (2006.01)

(52) U.S. Cl.  
USPC ............ 118/730; 118/719; 414/936; 414/941

(58) Field of Classification Search  
USPC ............... 156/345.32; 414/936, 941; 118/730  
See application file for complete search history.

(56) References Cited

U.S. PATENT DOCUMENTS

| | | | |
|---|---|---|---|
| 4,987,856 A | 1/1991 | Hey et al. | |
| 5,133,284 A | 7/1992 | Thomas et al. | |
| 5,655,060 A | 8/1997 | Lucas | |
| 5,855,681 A | 1/1999 | Maydan et al. | |
| 5,951,772 A * | 9/1999 | Matsuse et al. | 118/723 R |
| 6,143,082 A * | 11/2000 | McInerney et al. | 118/719 |
| 6,319,553 B1 | 11/2001 | McInerney et al. | |
| 6,578,891 B1 | 6/2003 | Suzuki et al. | |
| 6,760,976 B1 | 7/2004 | Martinson et al. | |
| 6,860,965 B1 | 3/2005 | Stevens | |
| 2001/0010950 A1 | 8/2001 | Savage et al. | |
| 2002/0033136 A1 | 3/2002 | Savage et al. | |
| 2003/0150849 A1* | 8/2003 | Beer et al. | 219/390 |
| 2004/0000378 A1* | 1/2004 | Lee et al. | 156/345.51 |
| 2004/0001750 A1* | 1/2004 | Kremerman | 414/744.1 |
| 2005/0095090 A1 | 5/2005 | Stone | |
| 2005/0113976 A1 | 5/2005 | van der Meulen | |
| 2005/0120578 A1 | 6/2005 | van der Meulen | |
| 2005/0158153 A1 | 7/2005 | Sundar et al. | |
| 2005/0160984 A1* | 7/2005 | Schmitt | 118/715 |

* cited by examiner

*Primary Examiner* — Parviz Hassanzadeh  
*Assistant Examiner* — Nathan K Ford  
(74) *Attorney, Agent, or Firm* — Nixon Peabody LLP; Joseph Bach, Esq.

(57) ABSTRACT

A semiconductor processing system and related methodology is disclosed and which includes a processing chamber having an internal cavity and a transfer port; a transfer chamber which is positioned adjacent to the processing chamber; and a transfer apparatus having at least two extendible arms which are positioned within the transfer chamber, and wherein each of the extendible arms carry a semiconductor work piece into and out of the processing chamber by way of the transfer port, and wherein the at least two extendible arms are selectively vertically moveable, and further are each selectively moveable in the direction of the transfer port.

17 Claims, 13 Drawing Sheets

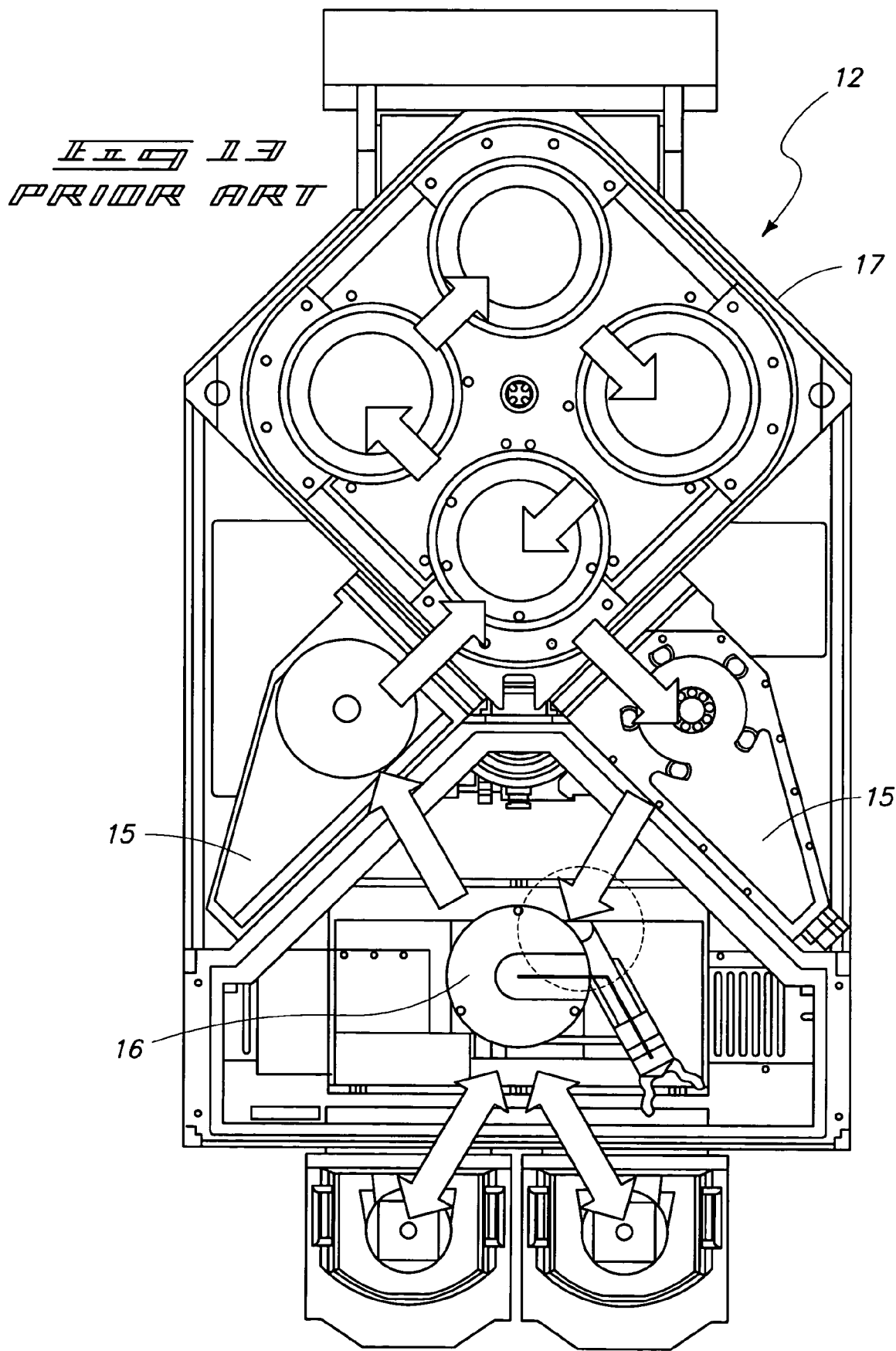

SEMICONDUCTOR PROCESSING SYSTEM; A SEMICONDUCTOR PROCESSING CHAMBER; AND A METHOD FOR LOADING, UNLOADING AND EXCHANGING SEMICONDUCTOR WORK PIECES FROM A SEMICONDUCTOR PROCESSING CHAMBER

CROSS REFERENCE TO RELATED APPLICATION

This application claims priority from Chinese Patent Application Serial No. 200510028562.8, which was filed on Aug. 5, 2005.

TECHNICAL FIELD

The present invention relates to a semiconductor processing system, a semiconductor processing chamber, and a method for loading, unloading and exchanging semiconductor work pieces from a semiconductor processing chamber, and more specifically, to a semiconductor processing system and related assemblies which are used in efficiently processing semiconductor work piece in a fashion not possible heretofore.

BACKGROUND OF THE INVENTION

The prior art is replete with numerous examples of semiconductor wafer handling equipment, and semiconductor processing chambers for processing semiconductor work pieces. The Office's attention is directed to the following prior art patents and published applications, the teachings of which are incorporated by reference herein: U.S. Pat. Nos. 5,133,284; 5,655,060; 5,855,681; 6,143,082; 6,319,553; 6,578,891; 6,760,976; 6,860,965; and 2001/0010950; 2002/0033136; 2004/0001750; 2005/0120578; and 2005/0113976. Additionally, the applicant of the present application directs the Offices' attention to pending U.S. patent application Ser. No. 11/351,786, and which was filed on Feb. 9, 2006. The teachings of this reference are also incorporated herein.

In the manufacturing of semiconductor work pieces, two forms of semiconductor processing systems are commonly employed. A first type of processing system that is commonly used in the semiconductor industry is the batch processing system which can process multiple semiconductor work pieces substantially simultaneously. The other type of semiconductor processing system that is used in the industry is a single piece processing device. In the semiconductor batch processing systems which are in common use, semiconductor work pieces are placed in either a horizontal or vertical orientation and are thereafter processed at the same time within a processing chamber.

In as much as numerous semiconductor work pieces are processed substantially simultaneously, the space or clearance between the semiconductor work pieces is typically quite limited. Therefore, these batch processing systems typically use low gas pressures in order to minimize, or substantially eliminate any gas pressure gradients which may occur within the processing chamber. As a general matter, if the clearance between semiconductor work pieces is larger than one fourth of their respective thickness, the internal gas pressure of the processing chamber should typically be less than about 500 milliTorr. With this gas pressure, the typical deposition rate on semiconductor work pieces is typically less than about 100 Angstroms per minute. This deposition rate typically means that longer processing times are required for batch processing systems.

It is well known that single semiconductor work piece processing systems have many advantages relative to providing substantially uniform products. However, significant shortcomings have detracted from the usefulness of such devices. Among the chief shortcomings of such devices have been problems associated with heat, slow processing speeds, low throughput, and relatively high overhead production costs.

To address the difficulties associated with the prior art batch processing systems, many approaches have been undertaken. For example, in U.S. Pat. No. 5,855,681, a batch processing system is shown and described and wherein the batch processing system includes a processing chamber having a plurality of processing stations. The processing chamber, therefore, can process multiple work pieces without further consideration of the problems associated with the positioning or spacing of the work pieces one from the other, which has heretofore limited the usefulness of batch processing systems. While this approach has had some success in addressing the problems associated with the throughput and quality of the semiconductor work pieces which are fabricated, it still cannot effectively process large numbers of work pieces substantially simultaneously.

Additionally, it should be recognized that one of the major problems affecting the quality of the resulting semiconductor work pieces is that the previous prior art devices do not provide uniform processing conditions at the respective processing stations within a processing chamber. It should be understood that uniformity of processing conditions across a plurality of processing stations is mainly influenced by two components, that being, the reaction gas provided to the processing chamber, and the temperature maintained within the processing chamber. In the prior art arrangements where the individual processing stations of a processing chamber are essentially isolated from each other, maintaining the uniformity of temperature between the several processing stations may be quite difficult. However, if the respective processing stations are not isolated from each other, the reaction gases from the several processing stations can potentially interfere with each other thereby creating non-uniform gaseous processing conditions among the several processing stations. Notwithstanding the developments in the prior art, the currently available processing chambers having multiple processing stations still cannot uniformly process large numbers of semiconductor work pieces substantially simultaneously.

Another approach which has been taken to solve the problems associated with increasing the output and quality of semiconductor work pieces produced by a batch processing system is seen in U.S. Pat. No. 6,860,965. While this processing system has many benefits, the loading system for same is complicated, and the speed of loading semiconductor work pieces for processing is considered quite slow. Therefore, the throughput of this device is still not commercially acceptable.

Therefore, there has been a long felt need in the industry to provide a semiconductor processing system, semiconductor processing chamber, and related methodology which can provide rapid loading and unloading of semiconductor work pieces, as well as improve the processing efficiency for semiconductor work pieces. In addition to the other shortcomings noted above, the remaining prior art batch processing devices have a common problem which relates to their complicated mechanical structures and the maintenance necessary to keep such structures operational. Still further, the cost of purchasing and, thereafter, operating such devices are rather significant when viewed from the aspect of the reduced product throughput.

A semiconductor processing system chamber and a method of loading, unloading, and exchanging semiconductor work pieces from a semiconductor processing system is the subject matter of the present application.

SUMMARY OF THE INVENTION

A first aspect of the present invention relates to a semiconductor processing system which includes a processing chamber having an internal cavity, and further defining a transfer port; a transfer chamber having an internal cavity and which is positioned adjacent to the processing chamber; and a transfer apparatus having at least two extendible arms which are positioned within the internal cavity of the transfer chamber, and wherein each of the extendible arms carry a semiconductor work piece into, and out of the processing chamber by way of the transfer port, and wherein the at least two extendible arms are selectively vertically moveable, and further are each selectively horizontally moveable in the direction of the transfer port.

Still another aspect of the present invention relates to a semiconductor processing chamber which includes a processing chamber having an internal cavity; a plurality of processing stations located within the internal cavity of the processing chamber, and wherein each of the processing stations have a reaction environment; and a pumping plate positioned within the internal cavity of the processing chamber and which defines a plurality of pumping apertures which correspond in number with, and are oriented in substantially coaxially alignment relative to the respective processing stations.

Still another aspect of the present invention relates to a method of loading semiconductor work pieces into an empty semiconductor processing system which includes the steps of:

a. providing a processing chamber having an internal cavity, and which further defines a transfer port which allows access to the internal cavity, and wherein the internal cavity defines n processing stations;

b. providing a semiconductor work piece indexing plate moveably mounted within the internal cavity;

c. providing a transfer chamber which is located adjacent to the transfer port of the processing chamber;

d. providing a transfer apparatus positioned within the transfer chamber, and which includes first and second extendible arms which are vertically and horizontally moveable, and which are further substantially vertically aligned one relative to the other, and which are operable to be pointed in the direction of the transfer port;

e. providing a loading chamber which is positioned adjacent to the transfer chamber;

f. picking up two semiconductor work pieces to be processed in the processing chamber from the loading chamber with the respective extendible arms;

g. rotating, and vertically and horizontally adjusting the first extendible arm to an orientation where the first extendible arm is in substantial alignment with the transfer port;

h. moving the first extendible arm carrying a semiconductor work piece from the transfer chamber through the transfer port and into the internal cavity of the processing chamber and placing the semiconductor work piece on the work piece indexing plate;

i. withdrawing the first extendible arm from the internal cavity;

j. rotating the work piece indexing plate by 1/n of a rotation;

k. rotating, and vertically and horizontally adjusting the second extendible arm to an orientation where the second extendible arm is in substantial alignment with the transfer port;

l. moving the second arm carrying a semiconductor work piece from the transfer chamber through the transfer port and into the internal cavity of the processing chamber and placing the semiconductor work piece on the work piece indexing plate;

m. withdrawing the second extendible arm from the internal cavity;

n. rotating the work piece indexing plate by 1/n of a rotation; and o. repeating steps f-n until the n processing stations each have a semiconductor work piece.

Still another aspect of the present invention relates to a method for unloading semiconductor work pieces from a semiconductor processing system which includes the steps of:

a. providing a processing chamber having an internal cavity, and which further defines a transfer port which allows access to the internal cavity, and wherein the internal cavity defines n processing station each having a semiconductor work piece which has been processed;

b. providing a semiconductor work piece indexing plate moveably mounted within the internal cavity;

c. providing a transfer chamber which is located adjacent to the transfer port of the processing chamber;

d. providing a transfer apparatus positioned within the transfer chamber, and which includes first and second extendible arms which are vertically and horizontally movable, and which are further substantially vertically aligned one relative to the other, and which are operable to be pointed in the direction of the transfer port;

e. providing a loading chamber which is positioned adjacent to the transfer chamber;

f. rotating, and vertically and horizontally adjusting the first extendible arm to an orientation where the first extendible arm is in substantial alignment with the transfer port;

g. moving the first extendible arm through the transfer port to pick up a processed semiconductor work piece from the work piece indexing plate;

h. withdrawing the first extendible arm carrying the processed semiconductor work piece from the internal cavity;

i. rotating the work piece indexing plate by 1/n of a rotation;

j. rotating, and vertically and horizontally adjusting the second extendible arm to an orientation when the second extendible arm is in substantial alignment with the transfer port;

k. moving the second arm through the transfer port to pick up a second processed semiconductor work piece from the work piece indexing plate;

l. withdrawing the second extendible arm carrying the processed semiconductor work piece from the internal cavity;

m. rotating, and vertically and horizontally adjusting the first and second arms so that they are each oriented generally in the direction of the loading chamber;

n. individually extending the first and second arms into the loading chamber so as to deposit the processed semiconductor work pieces in the loading chamber; and o. repeating steps f-n until the n processing stations are empty.

Yet a further aspect of the present invention relates to a method for exchanging semiconductor work pieces from a semiconductor processing system which includes the steps of:

a. providing a processing chamber having an internal cavity, and which further defines a transfer port which allows access to the internal cavity, and wherein the internal cavity defines n processing stations, and wherein at least one of the processing stations has a semiconductor work piece which has been processed;

b. providing a semiconductor work piece indexing plate moveably mounted within the internal cavity;

c. providing a transfer chamber which is located adjacent to the transfer port of the processing chamber;

d. providing a transfer apparatus positioned within the transfer chamber, and which includes first and second extendible arms which are vertically and horizontally adjustable, and which are further substantially vertically aligned one relative to the other, and which are operable to be pointed in the direction of the transfer port;

e. providing a loading chamber which is positioned adjacent to the transfer chamber;

f. rotating, and vertically and horizontally adjusting the first extendible arm to an orientation where the first extendible arm is in substantial alignment with the loading chamber;

g. extending the first extendible arm into the loading chamber to pick up an unprocessed semiconductor work piece, and withdrawing the first extendible arm from the loading chamber;

h. rotating the work piece indexing plate so as to position at least one processed semiconductor work piece in substantial alignment with the transfer port;

i. rotating, and vertically and horizontally adjusting the second extendible arm to an orientation where the second extendible arm is in substantial alignment with the transfer port;

j. extending the second extendible arm through the transfer port and into the internal cavity to pick up a processed semiconductor work piece, and withdrawing the second extendible arm from the processing chamber;

k. rotating, and vertically and horizontally adjusting the first extendible arm to an orientation where the first extendible arm is in substantial alignment with the transfer port;

l. extending the first extendible arm carrying the unprocessed semiconductor work piece into the internal cavity and depositing the unprocessed semiconductor work piece onto the work piece indexing plate, and withdrawing the first extendible arm from the processing chamber;

m. rotating, and vertically and horizontally adjusting the second extendible arm to an orientation where the second extendible arm is in substantial alignment relative to the loading chamber; and n. extending the second extendible arm into the loading chamber to deposit the processed semiconductor work piece in the loading chamber, and withdrawing the second extendible arm from the loading chamber.

These and other aspects of the present invention will be discussed in greater detail hereinafter.

BRIEF DESCRIPTION OF THE DRAWINGS

Preferred embodiments of the invention are described below with reference to the following accompanying drawings.

FIG. 13 is a top plan view of another prior art semiconductor processing system.

DETAILED DESCRIPTION OF THE PREFERRED EMBODIMENTS

This disclosure of the invention is submitted in furtherance of the constitutional purposes of the U.S. Patent Laws "to promote" the progress of science and useful arts" (Article 1, Section 8).

Figure 12:
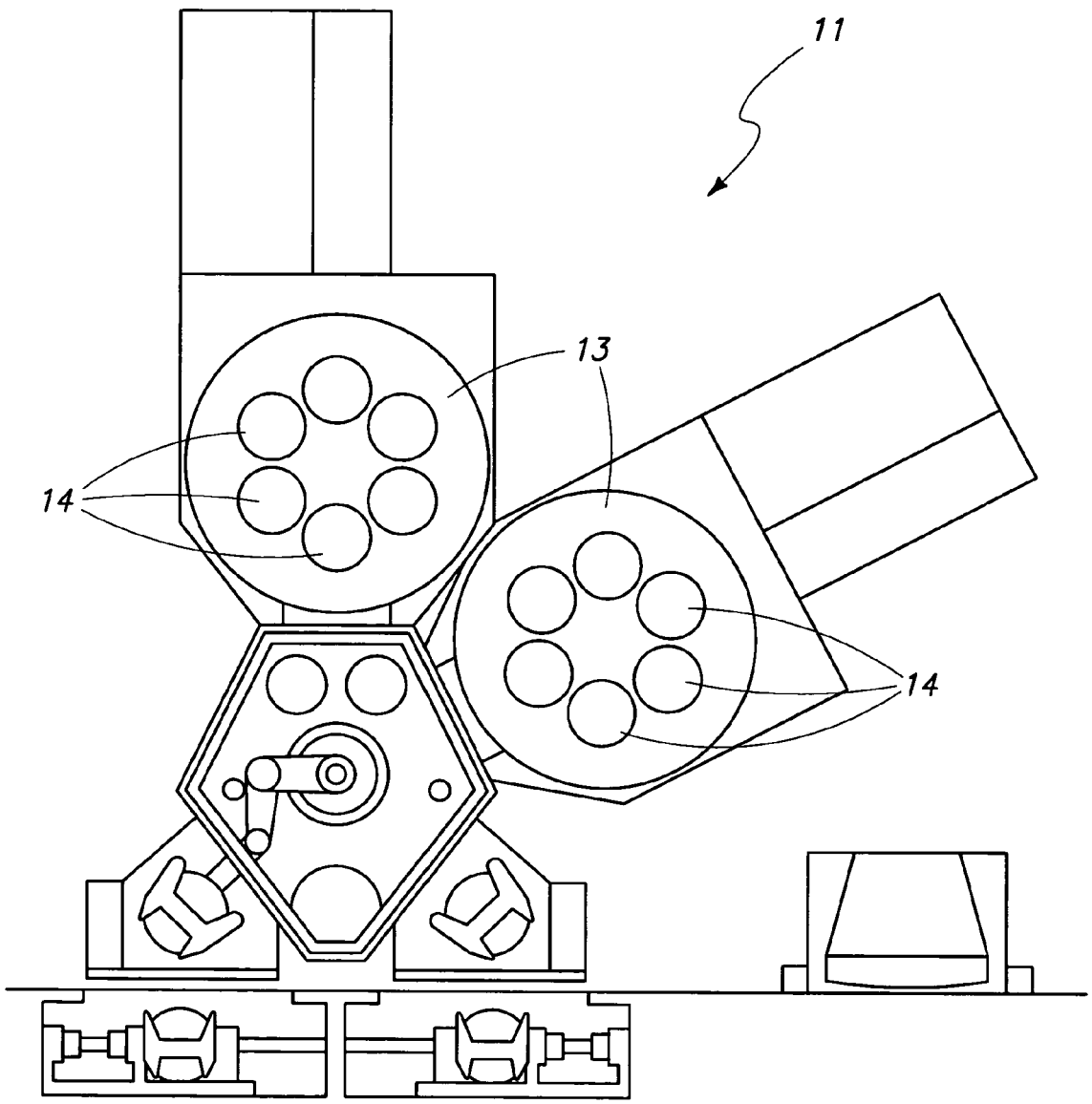
FIG. 12 is a top plan view of a prior art semiconductor processing system.

Referring to FIGS. 1-11, the present invention is generally indicated by the numeral 10. Referring first to the prior art assemblies as seen in FIGS. 12 and 13, it should be understood that FIG. 12 illustrates a prior art batch processing system as more fully described in U.S. Pat. No. 5,855,681. It should be understood that this first batch processing system 11 includes a processing chamber 13 having a plurality of processing stations 14, which are operable to receive individual semiconductor work pieces to be processed. This prior art assembly, of course, can process multiple semiconductor work pieces substantially simultaneously without regards to the problems associated between the spacing or clearance between semiconductor work pieces which have been problematic with other batch processing devices used heretofore.

Referring now to FIG. 13, a second prior art batch processing system which is generally indicated by the number 12 is shown, and which is more fully described in U.S. Pat. No. 6,860,965. The second prior art batch processing system 12 includes a simplified transfer chamber 15 which reduces the overall footprint of the second form of the prior art batch processing system 12. However, the loading system 16 as provided therewith, is rather complicated in its overall design, and the speed of loading semiconductor work pieces into the processing chamber 17 of same is considered rather slow. Consequently, the throughput of processed semiconductor work pieces from this prior art assembly is not considered acceptable. In addition to the shortcomings noted above, the same prior art assembly suffers from another shortcoming inasmuch as the arrangement as seen in FIG. 13 can only be utilized with a single processing chamber 17.

Figure 1:
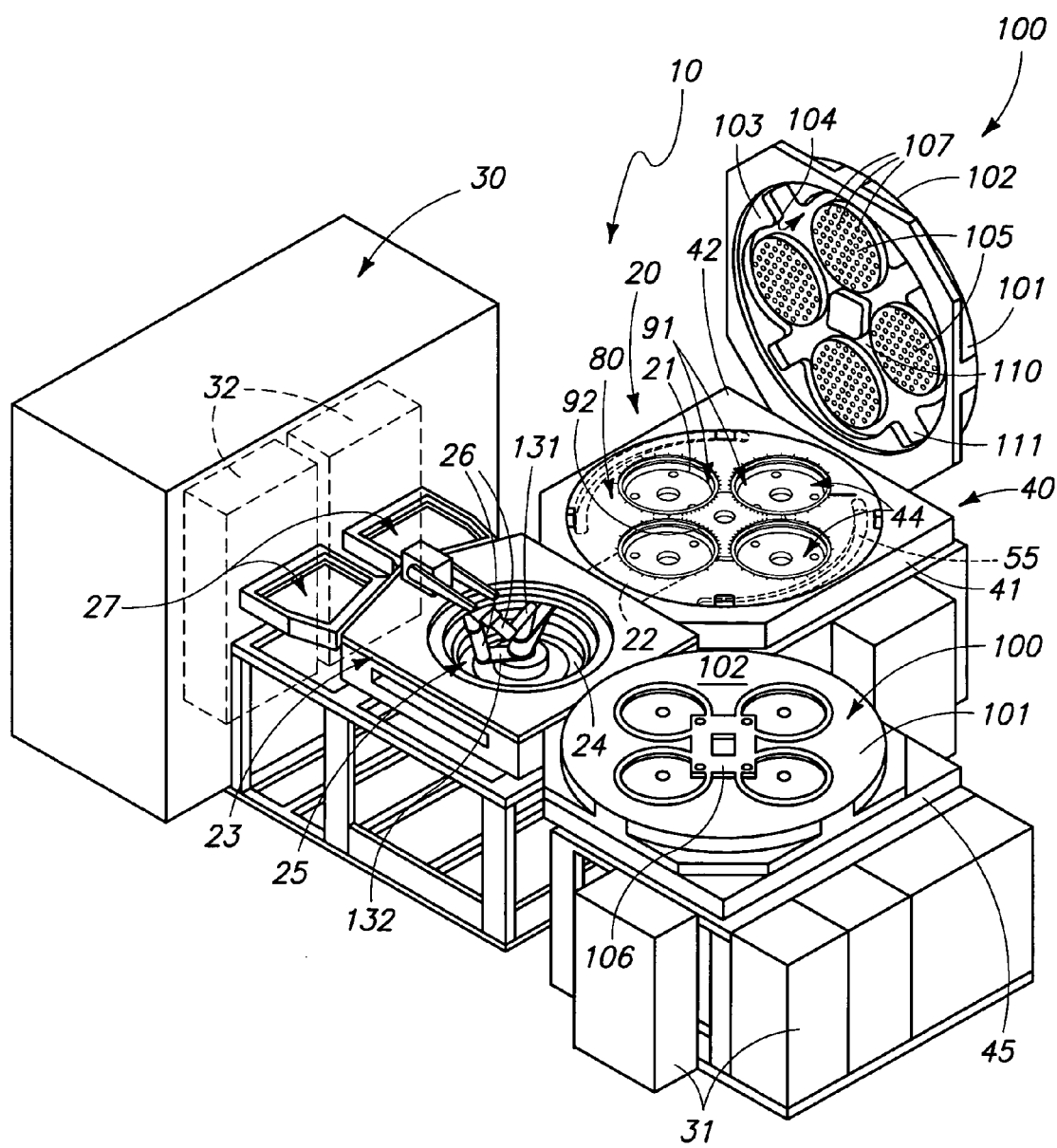
FIG. 1 is a perspective environmental view of the semiconductor processing system of the present invention.
Figure 2:
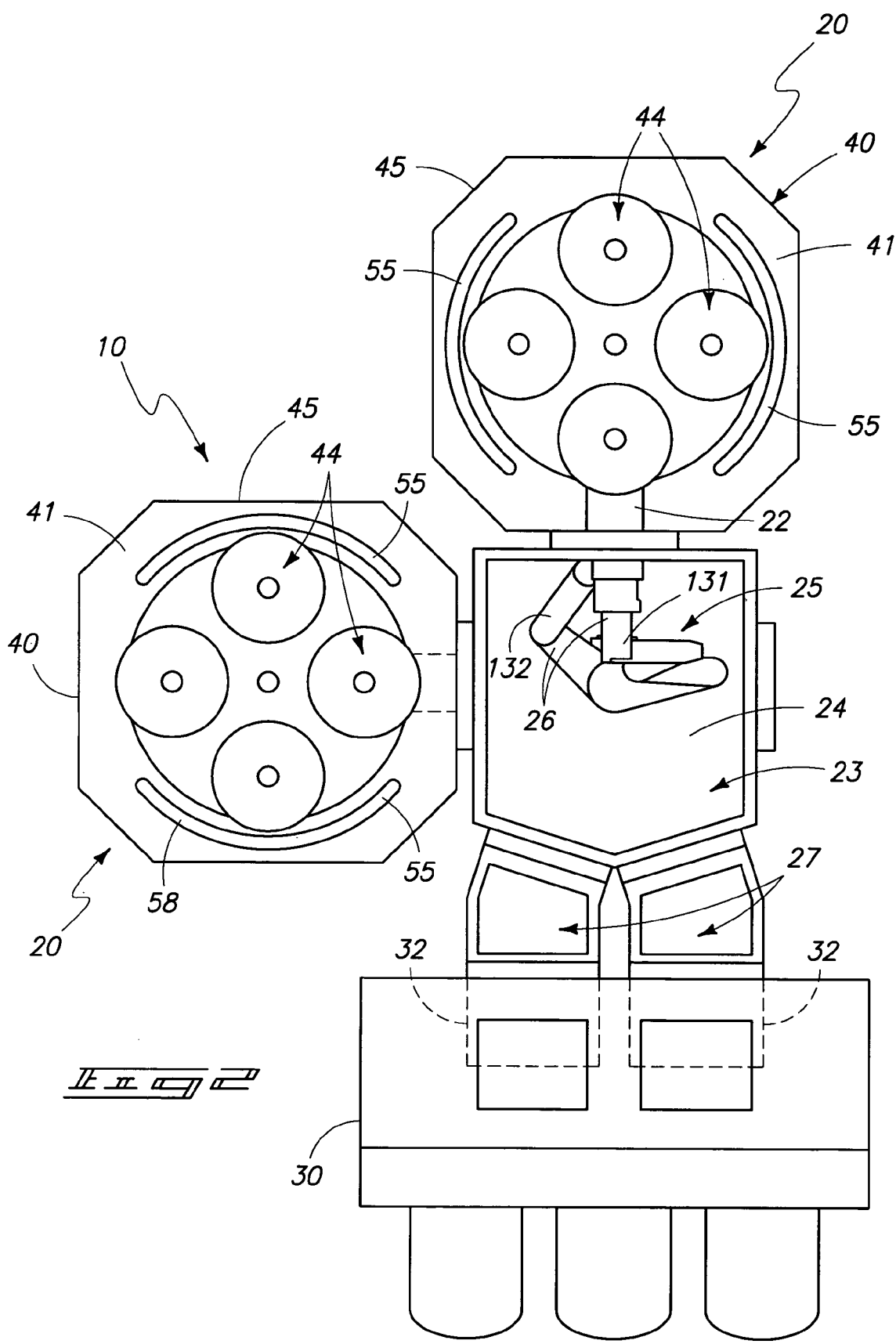
FIG. 2 is a fragmentary, top plan view of the semiconductor processing system of the present invention with some supporting surfaces removed to show the structure thereunder.

Referring now to FIG. 1, the semiconductor processing system 10 of the present invention is shown. It should be understood that some supporting surfaces and structures have been removed to illustrate the structure thereunder. It should be understood from FIG. 1 and following, that the semiconductor processing system 10 includes a plurality of processing chambers which are generally indicated by the numeral 20. Each of the processing chambers 20 define an internal cavity 21 which is operable to receive multiple semiconductor work pieces to be processed. Still further, each of the processing chambers define a transfer port 22 which allows a transfer apparatus, as will be described hereinafter, to move into and out of the internal cavity 21 in order to deliver semiconductor work pieces into the internal cavity 21 of the processing chamber. The semiconductor processing system 10 of the present invention further includes a transfer chamber 23, having an internal cavity 24, and which is positioned adjacent to the processing chamber 20. Positioned within the transfer chamber 23, is a transfer apparatus which is generally indicated by the numeral 25. The transfer apparatus 25 has at least two extendible arms 26 which will be described in greater detail hereinafter. Each of the extendible arms 26 carry a semiconductor work piece into and out of the processing chamber 20 by way of the transfer port 22. It should be understood that the at least two extendible arms 26 are selectively vertically moveable and further, are each selectively moveable in the direction of the transfer port 22. In addition to the foregoing, the semiconductor processing system 10 of the present invention includes a loading chamber which is generally indicated by the numeral 27, and which has a plurality of work piece cassettes which will be described in greater detail, hereinafter, and which are positioned adjacent to the transfer chamber 23. It should be understood that the at least two extendible arms 26 can be oriented so as to point at, and move toward, and away from, different work piece cassettes substantially simultaneously so as to pick up a semiconductor work piece or deliver a semiconductor work piece to one of the respective work piece cassettes. Each of these structures described above will be described in much greater detail in the paragraphs which follow.

The present invention 10 also includes a method for transferring semiconductor work pieces to a semiconductor processing system 10 as generally described, above. The method for transferring a semiconductor work piece includes, as a first step, providing a processing chamber 20 for processing the semiconductor work pieces, and wherein the processing chamber 20 defines a transfer port 22 which allows the semiconductor work pieces to move into and out of the processing chamber 20. Still further, the method includes another step of providing a transfer chamber 23, and positioning the transfer chamber adjacent to the processing chamber 20. The method includes another step of providing a transfer apparatus 25 which is positioned within the transfer chamber 23 and which has at least two moveable and extendible arms 26 and which are operable to move both horizontally and vertically so as to be appropriately oriented relative to the processing chamber 20, transfer port 22, and a loading chamber 27, as discussed below. Still further, the method includes another step of retrieving a semiconductor work piece from the processing chamber 20, with one of the extendible arms, by horizontally moving one of the extendible arms through the transfer port 22, and into the processing chamber 20. Still further, the method includes a step of retracting the extendible arm back through the transfer port 22 while carrying a semiconductor work piece. Still further in the present methodology, and after the step of retrieving the semiconductor work piece, the method includes another step of delivering another semiconductor work piece into the processing chamber 20 with another of the extendible arms by vertically and horizontally moving the other extendible arm to an appropriate orientation and then horizontally moving the other extendible arm through the transfer port 26 and into the processing chamber 20. As seen in the drawings, the respective extendible arms are positioned one above the other.

Figure 9:
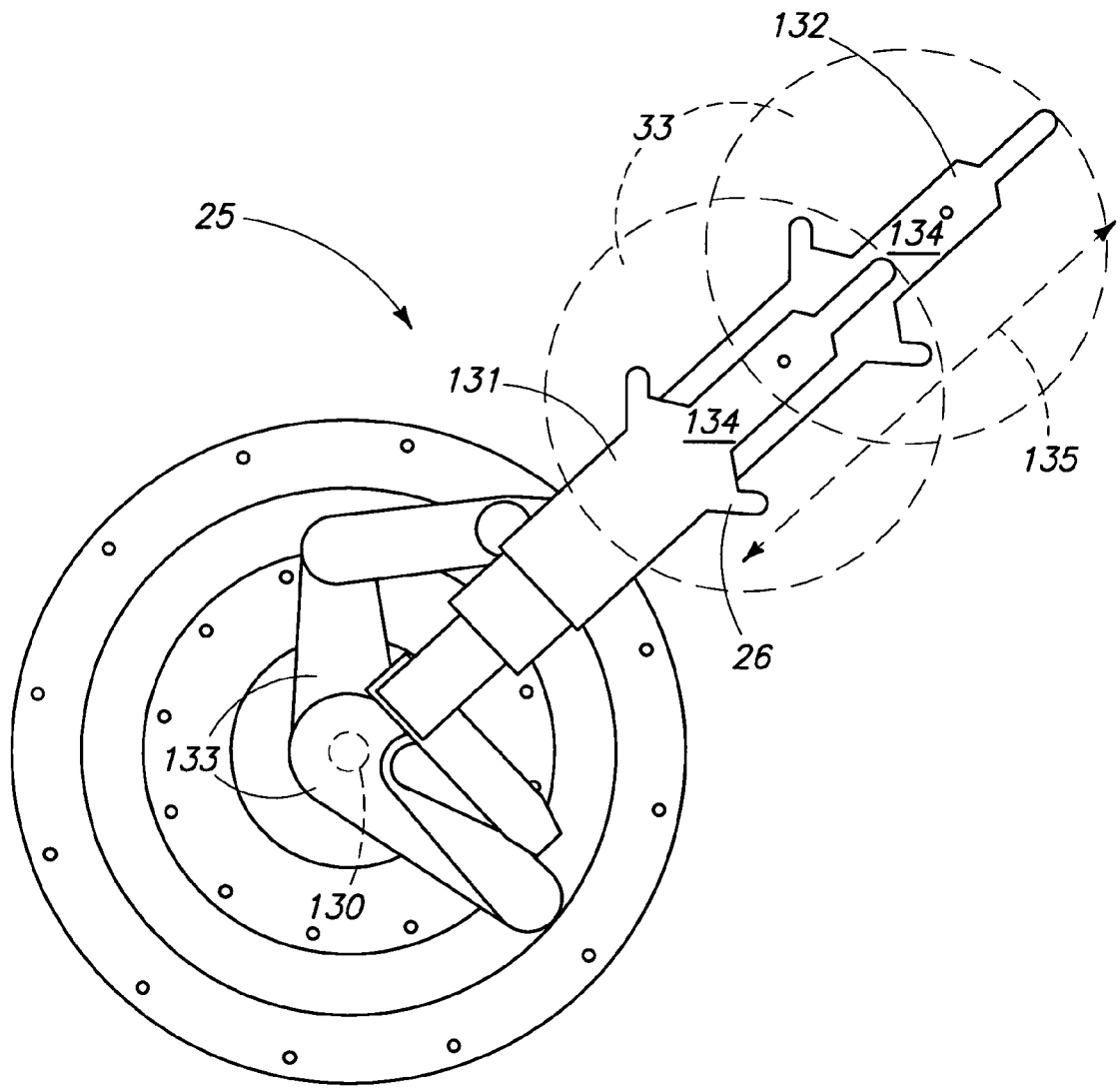
FIG. 9 is a fragmentary, top plan view of the transfer apparatus which is used in the present invention.
Figure 10:
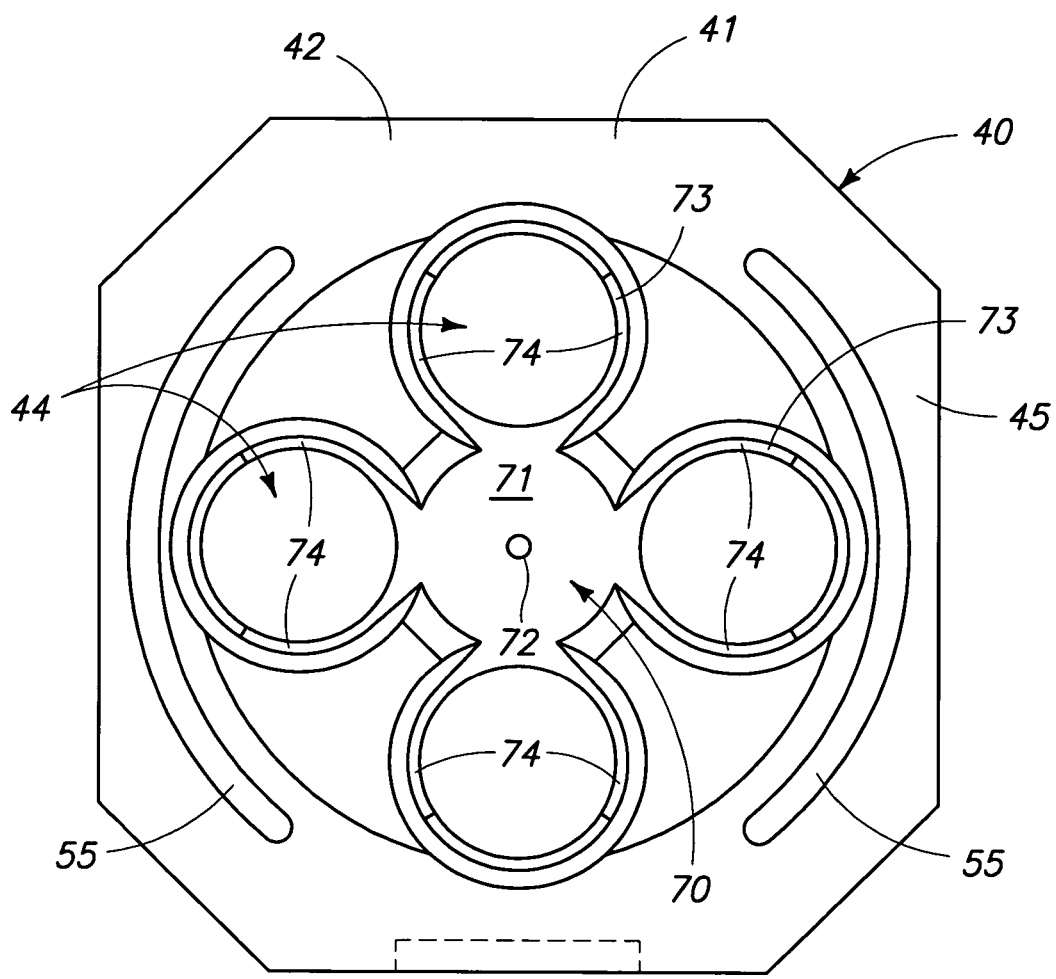
FIG. 10 is a greatly simplified top plan view of a work piece indexing plate as employed in the processing chamber of the present invention.
Figure 11:
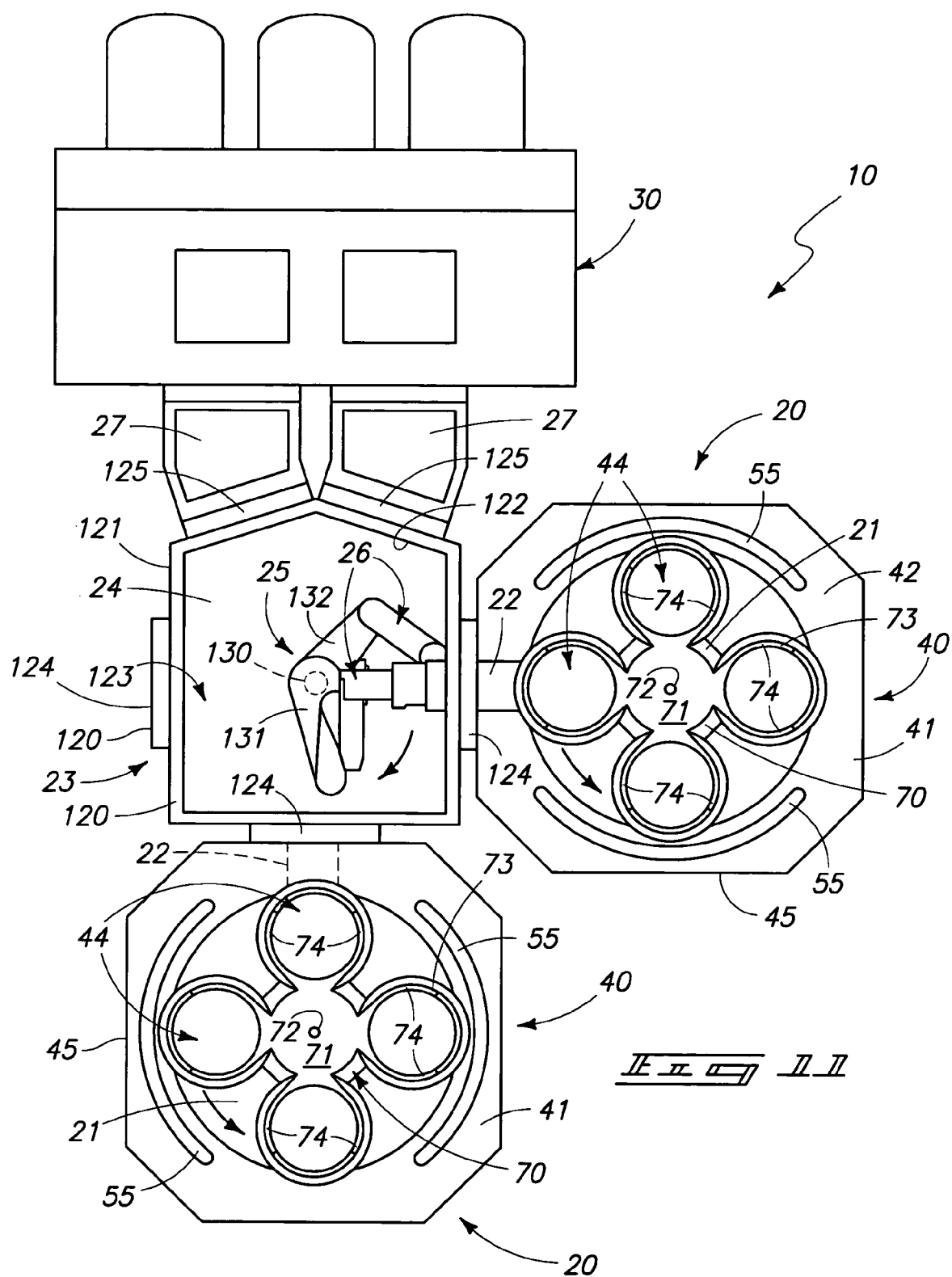
FIG. 11 is a somewhat simplified, top plan view which illustrates some of the steps in the methodology for loading, unloading, and transferring semiconductor work pieces of the present invention.

As seen in FIG. 1, the semiconductor processing system 10 of the present invention further includes a factory interface 30 which is coupled to the loading chamber 27. The factory interface 30 is well known to those who are skilled in the art, and further discussion regarding this assembly is not warranted. In addition to the foregoing, there is provided a control assembly which includes an exhaust apparatus, and a power supply apparatus which are generally indicated by the numeral 31, and which are further mounted adjacent to one of the processing chambers 20. The assembly 31 supplies reaction gases, and further provides an exhaust pump and other assemblies which are shared by each of the respective processing chambers 20. These assemblies are also well known in the art and further discussion regarding them is not warranted. Enclosed within the factory interface 30 are individual work piece cassettes 32, which are operable to receive individual semiconductor work pieces 33 which are then retrieved by the transfer apparatus 25 and delivered into the processing chamber 20 for further processing (FIG. 9). The methodology by which these semiconductor work pieces 33 are loaded, unloaded and exchanged relative to the semiconductor processing system 10, and the respective work piece cassettes 32 will be discussed in greater detail in the paragraphs which follow.

Figure 3:
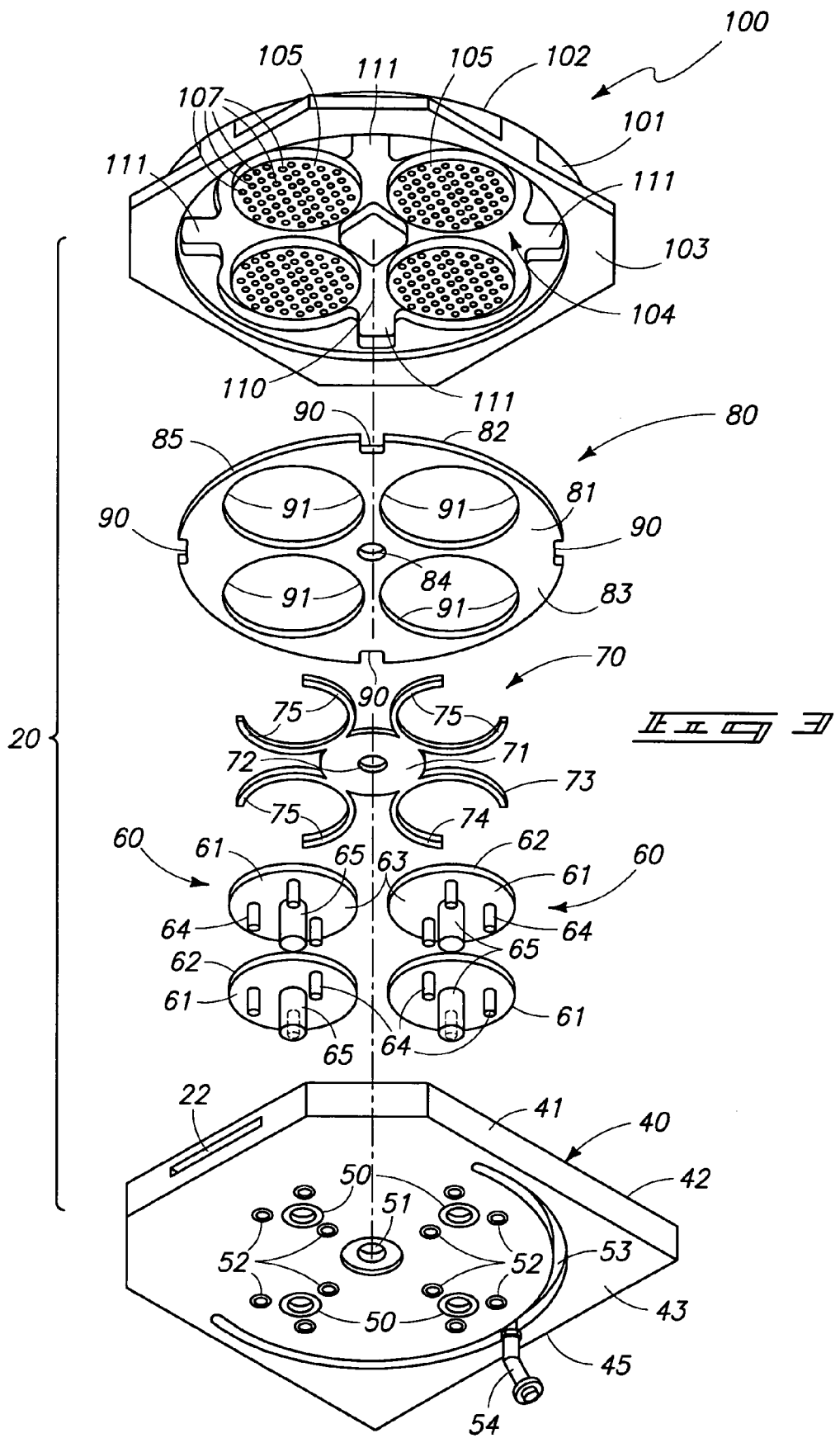
FIG. 3 is a perspective, fragmentary, exploded view of a portion of the processing chamber which is utilized in connection with the semiconductor processing system of the present invention.
Figure 4:
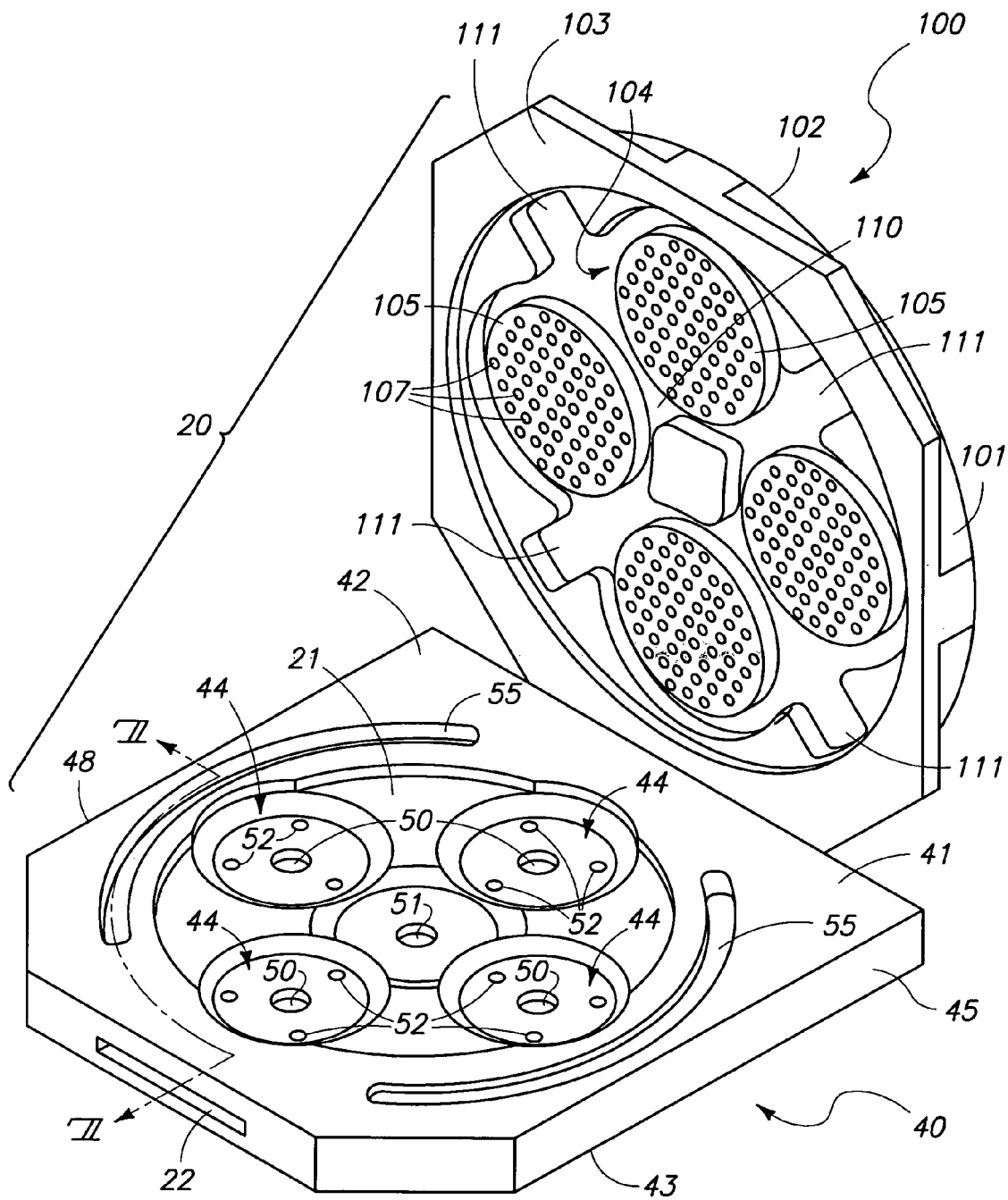
FIG. 4 is a perspective, fragmentary view of the processing chamber of the semiconductor processing system of the present invention, and showing the chamber lid in an open position.
Figure 5:
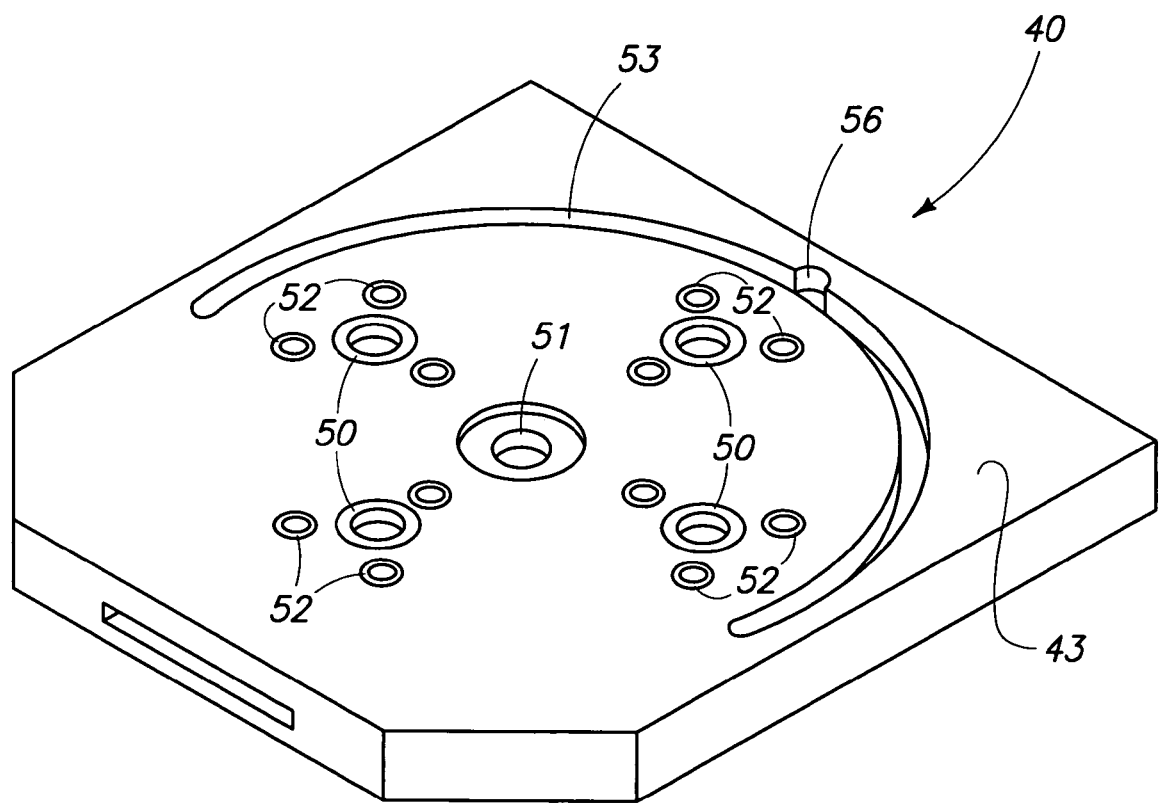
FIG. 5 is a perspective, fragmentary view of the bottom of the processing chamber utilized in connection with the semiconductor processing system of the present invention.

Referring now to FIGS. 3 and 4, the processing chambers 20 of the present invention as utilized in the arrangement as seen in FIG. 1, each include a chamber base 40 which is defined, at least in part, by a main body 41. The main body has a top surface 42, and an opposite bottom surface 43. A plurality of processing stations 44 are defined in the top surface and are operable to process individual semiconductor work pieces 33 in the manner which will be described in greater detail, hereinafter. Still further, it should be understood that the main body 41 has a peripheral edge 45 which may assume various shapes having multiple bevels. In the arrangement as seen in FIGS. 1 and 4, it will be appreciated that three processing chambers 20 can be positioned about the generally pentagonal shaped transfer chamber 23. However, it should be understood that, in other forms of the invention, the transfer chamber 23 can have other shapes such as a hexagonal shape which will allow four semiconductor processing chambers 20 to be positioned about same. The specifics regarding the structure of the transfer chamber 23 will be discussed in the paragraphs which follow.

Still referring to FIGS. 3 and 4, the chamber base 40 has a plurality of shaft holes 50 for receiving the shaft 65 of a pedestal 60 and which is located substantially centrally of each of the processing stations 44. Still further as seen in FIGS. 3 and 4, a central shaft hole 51 is operable to receive the shaft for a work piece indexing plate which will be discussed in greater detail hereinafter. Surrounding each of the shaft holes 50 which are formed substantially centrally of the plurality of processing stations 44 are individual lift pin shaft holes 52 which will accommodate lift pins which will work in combination with the pedestals 60 which will be described below. Additionally as seen in FIG. 3, an arcuately shaped exhaust passageway 53 is formed in the bottom surface 43 of the chamber base 40, and is operable to allow for the passage of reaction gases which are exiting the internal cavity 21 of the processing chamber 20 following the processing of the semiconductor work pieces 33. Still further, and coupled in fluid flowing relation relative to the exhaust passageway 53, is an exhaust apparatus conduit 54 which is connected to the exhaust apparatus. As earlier discussed, the exhaust apparatus is located in the control assembly 31 which is positioned adjacent to one of the processing chambers 20. In addition to the foregoing, and as seen by reference to FIG. 4, a pair of exhaust slots 55 are formed in the top surface 42, and partially surround the internal cavity 21. The exhaust slots 55 are operable to channel or otherwise direct reaction gases from the internal cavity 21 to the exhaust passageway 53 by way of a connecting slot or passageway 56 which is formed in the main body 41. This is best seen by reference to FIG. 7.

Referring now to FIG. 3, it will be seen that the processing chamber 20 includes the plurality of processing pedestals which are generally indicated by the numeral 60, and which are individually received, and located in the individual processing stations 14 as defined in the top surface 42 of the chamber base 40. As seen in FIG. 3, it should be understood that the respective pedestals 60 each are defined by a pedestal base 61, having a top surface 62, and an opposite bottom surface 63. The top surface 62 may be heated and is operable to support individual semiconductor work pieces 33 for appropriate processing within the internal cavity 21 of the processing chamber 20. Still further, and as seen from FIG. 3, each of the pedestals 60 mount a plurality of moveable lift pins 64 which are received in the respective lift pin shaft holes 52 as defined in the chamber base 40. The lift pins are operable to move upwardly and downwardly to engage the bottom surface of a semiconductor work piece 33 so that the work piece may be engaged by a work piece indexing plate which will be discussed in greater detail hereinafter. Each of the pedestals include a pedestal shaft 65 which extends substantially normally downwardly thereof, and which is received in the respective shaft holes 50 which are formed substantially centrally of the respective processing stations 44.

Still referring to FIG. 3, it will be seen that the chamber base 40 rotatably mounts a work piece indexing plate which is generally indicated by the numeral 70 and which is rotatable about a shaft, not shown, and which is received within the central shaft hole 51 which is formed in the top surface 42. As seen in the exploded view of FIG. 3, the work piece indexing plate 70 has a central portion or hub 71 in which a shaft hole 72 is formed. It should be understood, that a shaft (not shown) is received within the central shaft hole 51 and is further received within the shaft hole 72. This shaft thereby renders the work piece indexing plate 70 rotatable so as to be useful in transferring semiconductor work pieces 33 so that they may be appropriately oriented relative to the respective processing stations 44. In this regard, the work piece indexing plate has a top surface 73 which can engage or otherwise support a semiconductor work piece 33, and an opposite bottom surface 74. Still further, the work piece indexing plate 70 defines four pairs of transfer arms 75 which may be rotated so that they may be placed in a predetermined orientation above the respective processing stations 44. It should be understood that by coordinating the movement of the individual lift pins 64 which are found in each of the processing stations 44, and transfer arms 75 it is possible to move a semiconductor work piece 33 from the respective transfer arms 75 onto the pedestal 60; or alternatively move the semiconductor work pieces 33 from the pedestal 60 to the respective transfer arms 75. The movement of the semiconductor work pieces 33 to, and from, the transfer arms 75 are well known, and there can be many variations with regard to those movements which are not discussed in further detail herein. It should be understood that the work piece indexing plate 70 can be rotated in such a fashion so that one pair of transfer arms 75 can be oriented so as to be in substantial alignment relative to the transfer port 22, and thereafter cooperate with the transfer apparatus 25. When oriented in this fashion, the semiconductor work pieces 33 can be loaded or unloaded from the semiconductor processing chamber 20 utilizing the methodology which will be discussed in greater detail below. A more specific example of an arrangement which is useful for the movement of semiconductor work pieces is found in copending U.S. patent application Ser. No. 11/351,786, and which was filed on Feb. 9, 2006. The teachings of this application are incorporated by reference herein.

Figure 6:
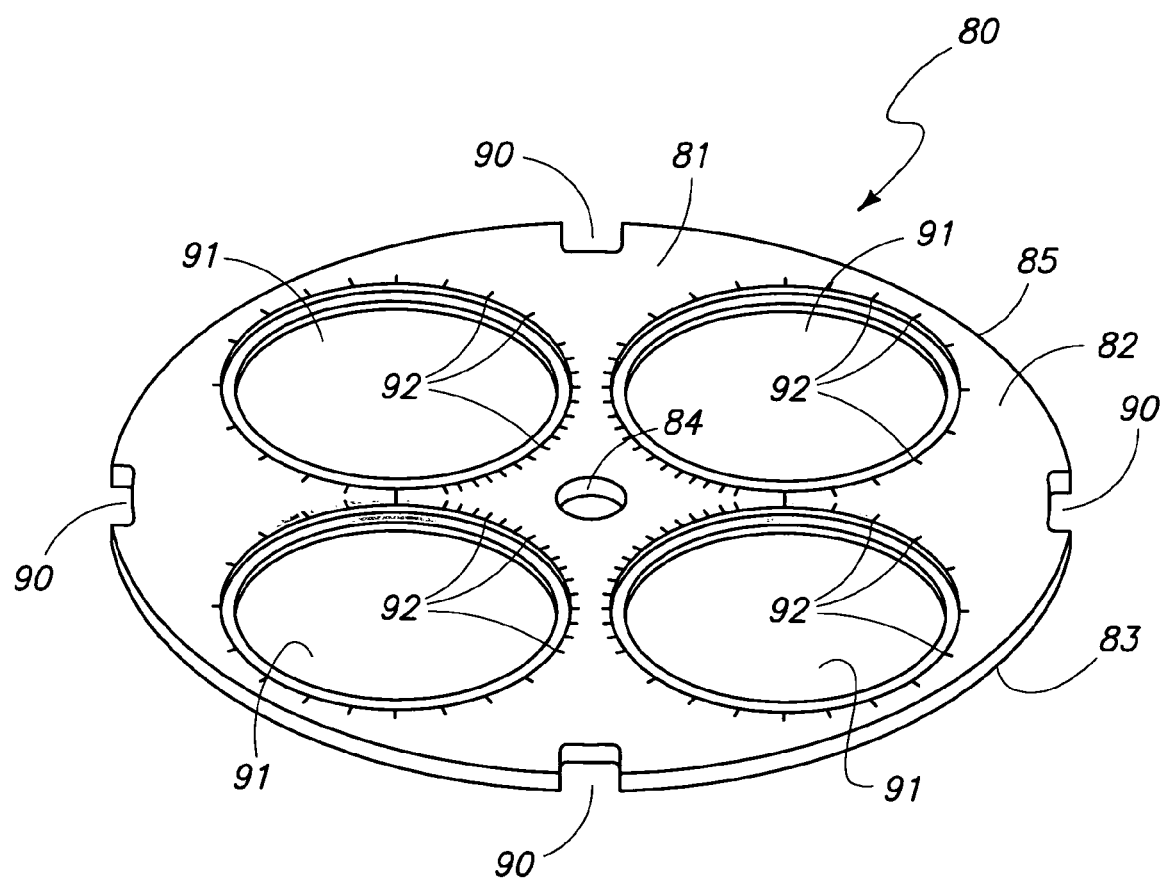
FIG. 6 is a fragmentary, perspective view taken of a pumping plate which is a feature of the present invention.
Figure 7:
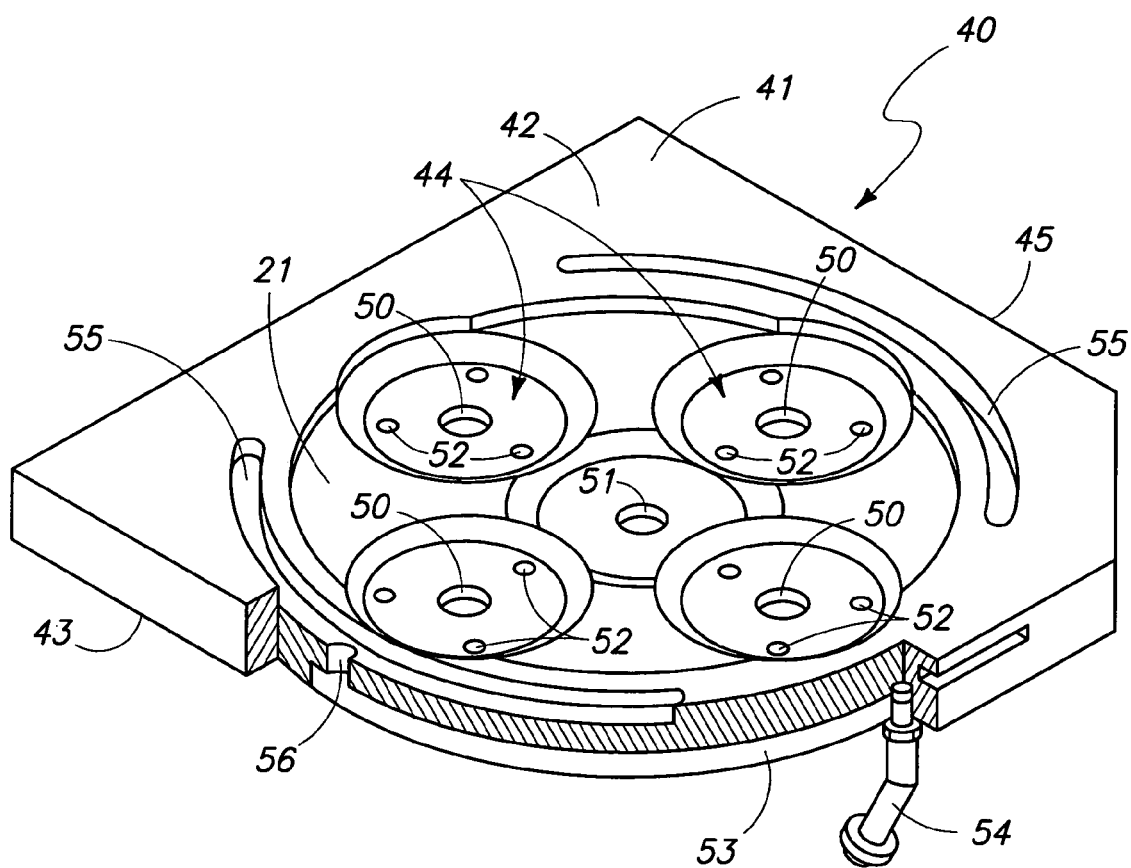
FIG. 7 is a fragmentary, perspective, transverse vertical sectional view taken from position along line 7-7 of FIG. 4.

Referring now to FIGS. 3, 4 and 6, and positioned in covering relation relative to the top surface 42 of the chamber base 40, is a pumping plate which is generally indicated by the numeral 80. The pumping plate 80 has a main body 81, having top and bottom surface 82 and 83 respectively. As seen in the drawings, a central aperture 84 is formed therein, and further, the main body 81 has a peripheral edge 85 which defines a plurality of exhaust ports 90, and which individually cooperate with the processing chamber 20, as will be described, hereinafter. Still further, the main body 81 defines a plurality of pumping apertures 91 which are individually substantially coaxially aligned relative to the respective processing stations 44, and which are defined, at least in part, by the chamber base 40. The inside diametral dimensions of the respective pumping apertures 91 ensure the effective removal of the reaction gases from the internal cavity 21 of the processing chamber 20. As seen by reference to FIG. 6, a plurality of radially oriented slots 92 are formed in the pumping plate in a fashion which facilitates the removal of reaction gases in an advantageous manner. In this regard, it should be understood that the spacing of the radially oriented slots 92 are so arranged that the respective radially oriented slots 92 are spaced farther apart in the region of the pumping plate which is adjacent to the peripheral edge 85 thereof. It should be understood that the respective radially oriented slots or channels 92 are disposed in fluid flowing communication with the respective exhaust ports 90, and which are formed in the pumping plate 80. It should be understood that the respective exhaust ports 90, as defined by the pumping plate 80, are disposed in fluid communication with the exhaust slots 55 which are positioned around some of the semiconductor work piece processing stations 44.

Therefore, one aspect of the present invention relates to a semiconductor processing chamber 20 having an internal cavity 21, and which further includes a plurality of processing stations 44 located within the internal cavity of the processing chamber. It should be understood that the individual processing stations 44 define a reaction environment. Still further, the semiconductor processing chamber 20 has a pumping plate 80 which is located within the internal cavity 21 of the processing chamber 20, and which defines a plurality of pumping apertures 91 which correspond in number with, and are further oriented in substantially coaxially alignment relative to, the respective processing stations 44. It will be appreciated from the drawings that the respective pedestals 60 which are mounted on the chamber base 40, are individually coaxially aligned relative to each of the coaxially aligned pumping apertures 91, and the associated shower heads, which will be discussed in greater detail hereinafter. The respective heated pedestals 60, pumping apertures 91, and associated shower heads as will be discussed in greater detail, below, define the respective processing station 44 within which the semiconductor work pieces 33 are processed.

Referring now to FIGS. 1, 3 and 4, it should be understood that the semiconductor processing chamber 20 hingedly cooperates with a processing chamber lid which is generally indicated by the numeral 100. The processing chamber lid 100 has a main body 101 with a top or outside facing surface 102, and an opposite, bottom or inside facing surface 103. As seen in the drawings, the bottom or inside facing surface defines a cavity 104, and a plurality of shower heads 105 are mounted within the cavity 104, and are further coupled in fluid flowing relation relative to a reaction gas manifold 106 which is mounted on the top or outside facing surface 102. It should be understood that the manifold 106 is coupled with a suitable source of a reaction gas which is supplied to the individual processing stations 44. As should be appreciated from the drawings, when the processing chamber lid 100 is disposed in the closed position, as seen in FIG. 1, it provides a substantially airtight seal, thereby allowing a source of a reaction gas to be supplied to each of the processing stations 44 in an advantageous fashion. It should be understood that the individual shower heads 105 are substantially coaxially aligned relative to the individual pumping apertures 91. It should also be understood that the shower heads 105 each define a plurality of small apertures 107 which allows the source of reaction gas to escape into the individual processing stations 44.

Referring still to FIGS. 3 and 4, it will be seen that the inside facing surface 103 of the processing chamber lid 100 defines a recessed region 110 which substantially surrounds the respective shower heads 105. Still further, a plurality of radially oriented channels 111 are formed in the inside facing surface 103 of the processing chamber lid 100, and are further coupled in fluid flowing relation relative to the recessed region 110 which surrounds the respective shower heads 105. It should be understood that the radially oriented channels 111 are disposed in fluid communication with the plurality of exhaust ports 90 which are formed about the peripheral edge 85 of the pumping plate 80. In the present invention, it should be understood that a semiconductor work piece 33 to be processed, is placed on one of the heated pedestals 60 which is located within the processing chamber 20. Still further, a source of a reaction gas is coupled in fluid flowing relation relative to the respective shower heads 105; and further, the exhaust apparatus which may be positioned in the control assembly 31, and which is coupled to the exhaust apparatus conduit 54, draws the reaction gas through the processing chamber 20, and along a course of travel. The course of travel extends, at least in part, from the respective shower heads 105, into the pumping apertures 91 where it then contacts the semiconductor work piece 33. After contacting the semiconductor work piece, the reaction gas then enters into the radially oriented slots 92 which are defined by the pumping plate 80. Further, the reaction gas then exits the pumping plate 80, and enters into the recessed region 110 of the chamber lid 100, and then exits by way of the radially oriented channels 111. The reaction gas then passes through the exhaust ports 90, and into the exhaust slots 55 which are formed in the chamber base 40. The reaction gas then travels along the exhaust passageway 53 (FIG. 7) to the exhaust apparatus, as earlier described. It should be understood that in this form of the invention, a source of an inert gas may also be supplied to the bottom surface of each of the heated pedestals 60 to form an inert gas screen which prevents reaction gases from leaking in through a gap that may exist between the heated pedestal 60, and the pumping plate 80. With this arrangement, cross-interference between reaction gases of the respective processing station is substantially avoided.

In order to ensure a more uniform flow of reaction gases through the processing stations 44, the distribution of the radially oriented slots 92 formed in the pumping plate 80 are spaced at a greater distance apart on the side closest to the peripheral edge 85 of the pumping plate 80. It should be understood that during the processing of a semiconductor work piece 33, the semiconductor work piece 33 rests upon the pedestal 60, and each of the pumping apertures 91 of the pumping plate 80 are positioned right above the respective pedestals 60. Additionally, the individual shower heads 105 are abutting and in substantially coaxially alignment relative to the respective pumping apertures 91. Therefore, the respective pedestals 60 are positioned in closely adjacent, spaced relation relative to the pumping plate 80, and the semiconductor work pieces 33 (shown only in FIG. 9) to be processed rest thereon, and are located between the pedestal 60 and the overlying pumping plate 80. It should be understood that various measures can be taken to locate the individual transfer arms 75 in positions where they do not impede or otherwise block the pedestal 60, and further do not effect the direct injection of reaction gas from the shower head 105 onto the semiconductor work piece which rests upon the pedestal 60.

Figure 8:
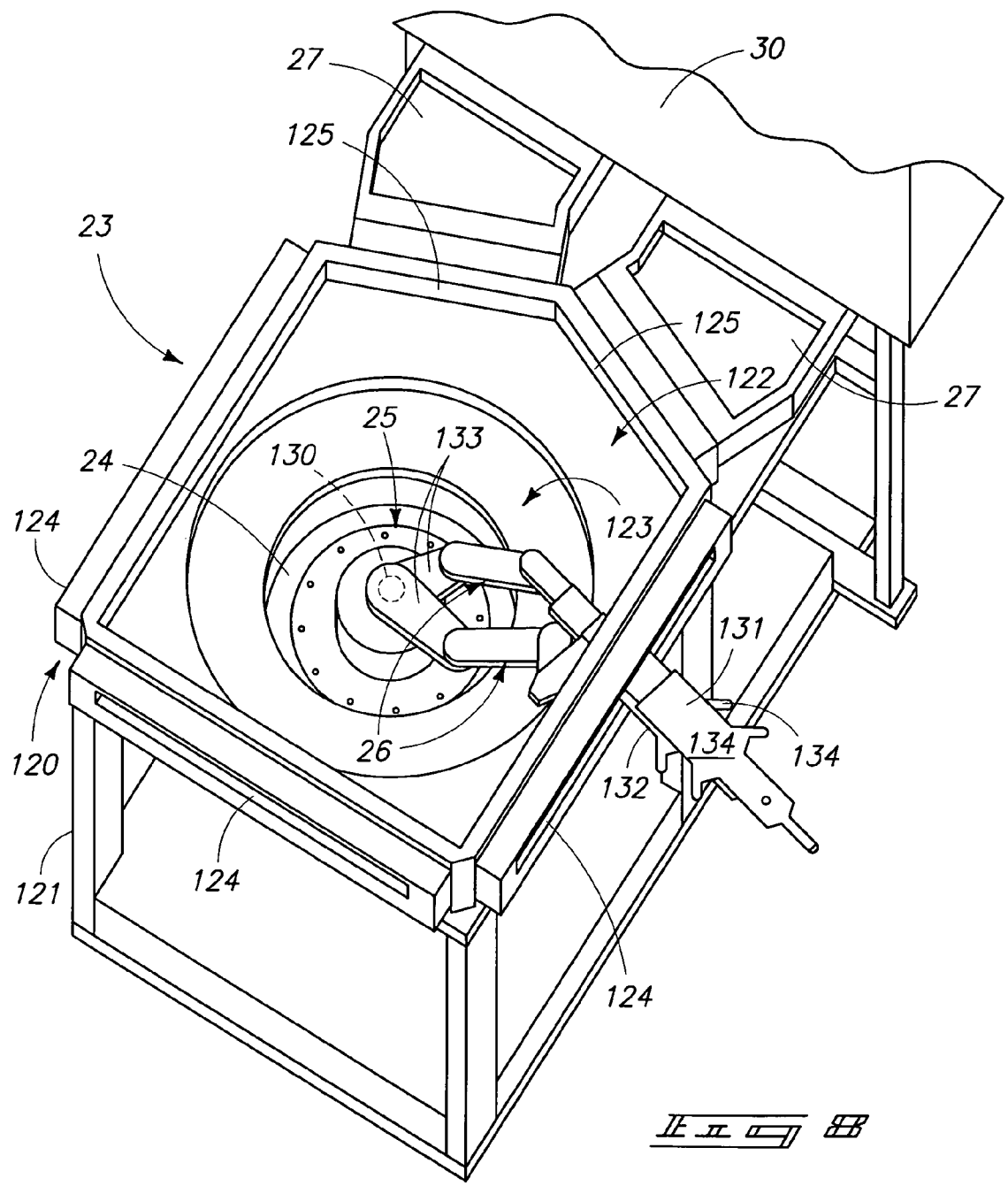
FIG. 8 is a perspective, enlarged, top plan view of a loading chamber, and transfer chamber as employed in the semiconductor processing system of the present invention.

Referring more specifically to FIG. 8, it will be understood that the transfer chamber 23 is defined by a housing 120 which has an exterior facing surface 121, and an opposite interior facing surface 122, which defines an internal cavity 123. The internal cavity 123 is operable to enclose the transfer apparatus 25 which will be described in greater detail, below. As seen by reference to FIG. 8, a plurality of processing chamber ports 124 are coupled or otherwise oriented in coaxial alignment relative to the respective transfer ports 22 which are formed in the respective processing chambers 20. Processing chamber ports 124 permit the movement of the at least two extendible arms 26 into and out of the internal cavity 21 of the processing chamber 20. As seen in the drawings, three processing chamber ports 124 are formed in the housing 120, thereby allowing three processing chambers 20 to matingly couple or cooperate with same. As seen in FIG. 8, the housing 120 is generally a pentagon. Therefore, the transfer chamber 23 can accommodate or cooperate with three processing chambers 20. However, other housing shapes may be utilized in order to increase the number of processing chambers Which may matingly couple with the transfer chamber 23. In addition to the foregoing, the housing 120 defines a plurality of loading chamber ports 125 which are operable to matingly couple or cooperate with the loading chamber 27. The loading chamber ports permit the at least two extendible arms 26 to move into and remove or otherwise place semiconductor processing work pieces 33 in the loading chamber 27.

Positioned within the internal cavity 123 of the housing 120, are the two vertically and horizontally moveable and extendible arms 26, which are used to load and unload semiconductor work pieces 33 from the processing chamber 20, and the loading chamber 27. In this regard, it should be understood that the transfer apparatus 25 includes a substantially vertically oriented shaft 130 which is positioned substantially centrally relative to the internal cavity 123, and which has mounted thereon first and second extendible arms 131 and 132 respectively. The respective arms are disposed in predetermined spaced relation, one relative to the other. As best illustrated by reference to FIGS. 8 and 9, the at least two extendible arms 26 which are identified herein as the first and second extendible arms 131 and 132, are each substantially vertically aligned when each of the arms are pointing in the direction of the transfer port 22. As seen in FIG. 8, the respective first and second extendible arms are individually operable to extend through at least one of the process chamber ports 124 and would be oriented so as to be simultaneously received within or pass through the transfer port 22 of one of the processing chambers 20. It should be understood that the respective first and second extendible arms 131 and 132 each have a proximal end 133, which are individually mounted on the vertically oriented shaft 130, and are further moveable therealong. Still further, the respective extendible arms are freely reciprocally moveable along the substantially horizontal path of travel 135 between the loading chamber 27, and the respective processing chamber ports 124, which are substantially coaxial aligned relative to the transfer ports 22, and which are further defined by the respective processing chambers 20.

As seen most clearly by reference to FIG. 9, individual semiconductor work pieces 33 rest on the distal end 134 of the respective first and second extendible arms 131 and 132 respectively. It should be understood from a study of FIG. 1 that the first and second extendible arms 131 and 132 are operable to extend from the transfer chamber 23 into the processing chamber 20; or alternatively, into the loading chamber which is generally indicated by the numeral 27. As earlier described, the loading chamber 27 has a plurality of semiconductor work piece cassettes which are generally indicated by the numeral 32, and which are positioned adjacent to the transfer chamber 23. The respective extendible arms 131 and 132 can be oriented so as to point at, and move toward, and away from, different work piece cassettes substantially simultaneously so as to pick up a semiconductor work piece 33, or deliver a semiconductor work piece 33 to one of the respective work piece cassettes. In the arrangement as seen in the drawings, it should be understood that the work piece cassettes may include four work piece cassettes, although only two are currently illustrated in the drawings. It should be understood that the loading chamber 27 may include an upper and lower portion, not shown and wherein a cooling liner may be located within the lower portion. A plurality of work piece cassettes may be positioned in the upper and lower portions of the loading chamber 27 to receive the processed semiconductor work pieces provided by the processing chamber 20.

In the method of transferring a semiconductor work piece 33 in a semiconductor processing system 10 of the present invention, the methodology as contemplated by the present invention includes a step of rotating the transfer apparatus 25 in a substantially horizontal plane within the transfer chamber 23, and further providing a substantially vertically oriented main shaft 130 within the transfer chamber. Still further, the method as contemplated by the present invention includes a step of moving the transfer apparatus 25 to selective locations along the main shaft 130, and further providing a loading chamber 27 which is positioned adjacent to the transfer chamber, and which stores a plurality of semiconductor work pieces 33 to be processed in the processing chamber 20. The method as contemplated by the present invention further includes another step of retrieving at least two unprocessed semiconductor work pieces 33 from the loading chamber 27 with the transfer apparatus 27. In the method of the present invention for transferring semiconductor work pieces, the method further contemplates a step of defining a plurality of semiconductor work piece processing stations 44 within the processing chamber 20, and wherein the semiconductor work piece processing stations each have a peripheral edge, and positioning a plurality of exhaust slots 55 around each of the processing stations 44. The method further includes another step of forming an exhaust passage 53 in the processing chamber 20; and coupling the respective exhaust slots 55 in fluid flowing relation relative to the exhaust passageway to form an exhaust system.

In the method for transferring semiconductor work pieces, the step of providing a processing chamber 20 further includes the steps of providing a processing chamber lid 100 which mounts a plurality of shower heads 105 which are located within the processing chamber 20; providing a processing chamber base 40 which cooperates with the processing chamber lid 100; and providing a plurality of heated pedestals 60 which are mounted on the processing chamber base 40, and which are each substantially coaxial aligned relative to the respective shower heads 105. The method further includes another step of providing a pumping plate 80 having a peripheral edge 85, and which is positioned between the processing chamber lid 100 and the processing chamber base 40, and wherein the pumping plate has an exhaust port 90. The method of the present invention further includes another step of forming a plurality of pumping apertures 91 in the pumping plate 80, and which correspond with, and are further coaxially aligned relative to, the respective shower heads 105, and the individual heated pedestals 60. The present method includes another step of forming a plurality of radially oriented slots 92 in the pumping plate 80, and which extend radially outwardly relative to the respective pumping apertures 91, and wherein the respective shower heads 105; pumping apertures 91; and heated pedestals 60 collectively define the respective semiconductor work piece processing stations 44 within the processing chamber 20. As earlier described, the step of forming the plurality of radially oriented slots 92 in the pumping plate 80 further comprises a step of varying the spacing of the radially oriented slots so that the respective radially oriented slots 92 are spaced farther apart in the region of the pumping plate 80 which is adjacent to the peripheral edge 85 thereof.

In the method of transferring semiconductor work pieces as described above, the step of providing a processing chamber lid 100 further comprises the steps of forming a recessed region 110, in the processing chamber lid 100, and which substantially surrounds the respective shower heads 105; and forming a plurality of radially oriented channels 111 in the chamber lid 100, and which are coupled to the recessed region. Still further, the step of forming the plurality of radially oriented channels 111 further comprises coupling the respective radially oriented channels 111 in fluid flowing communication with the exhaust port 90 of the pumping plate 80. The method, as contemplated by the present invention further includes another step of coupling the exhaust port 90, of the pumping plate 80, in fluid communication with the radially disposed exhaust slots 55 which are positioned around some of the semiconductor work piece processing stations 44. The methodology as described above includes another step of providing an exhaust apparatus, here shown, at least in part, as an exhaust apparatus conduit 54, and mounting the exhaust apparatus conduit on the processing chamber base 40, and further coupling the exhaust passageway 53 of the processing chamber 20 with the exhaust apparatus. The method includes another step of coupling the exhaust slots 55 which are located around some of the processing stations 44, in fluid communication with the exhaust passageway 53. In the methodology which is described above, the method of transferring further includes another step of delivering a source of an inert gas to the peripheral edge of the semiconductor work piece processing stations 44 so as to form an inert gas screen around each of the semiconductor work piece processing stations. The method, as described above, further includes another step of vertically and horizontally adjusting the fist extendible arm 131 and then extending the first extendible arm 131 into the loading chamber 27 to pick up an unprocessed semiconductor work piece 33, and withdrawing the first extendible arm 131 from the loading chamber 27. The method further includes another step of rotating and vertically and horizontally adjusting the second extendible arm 132 to an orientation which is in substantial alignment relative to the transfer port 22; and extending the second extendible arm 132 through the transfer port 22 so as to pick up a processed semiconductor work piece 33 from the work piece indexing plate 70, and withdrawing the second extendible arm 132 from the internal cavity 21. The method, as described above, further includes another step of rotating and vertically and horizontally adjusting the first extendible arm 131 to an orientation which is in substantial alignment with the transfer port 22; and extending the first extendible arm 131 carrying the unprocessed semiconductor work piece 33, through the transfer port 22, and depositing the unprocessed semiconductor work piece 33 onto the work piece indexing plate 70. The method of the present invention includes a further step of withdrawing the first extendible arm 132 following the deposit of the unprocessed semiconductor work piece 33. The method includes another step of rotating and vertically and horizontally adjusting the second extendible arm 132 to an orientation which is in substantial alignment relative to the loading chamber 20, and moving the second extendible arm 132 into the loading chamber 20 so as to deposit the processed semiconductor work piece 33 in the loading chamber 20.

In the methodology of transferring semiconductor work pieces as described above, the method includes a further step of providing n pairs of transfer arms 75 which are mounted on the work piece indexing plate 70; and rotating the work piece indexing plate 70 so as to orient each pair of transfer arms 75 with the respective n processing stations 40.

A method for unloading semiconductor work pieces 33 from a semiconductor processing system 10 is disclosed, and which includes, a first step of providing a processing chamber 20, having an internal cavity 21, and which further defines a transfer port 22 which allows access to the internal cavity 21, and wherein the internal cavity 21 defines n processing stations 44, each having a semiconductor work piece 33 which has been processed. The method of unloading includes another step of providing a semiconductor work piece indexing plate 70 which is moveably mounted within the internal cavity 21; and providing a transfer chamber 23 which is located adjacent to the transfer port 22 of the processing chamber 20. The method for unloading semiconductor work pieces 33 from a semiconductor processing system 10 further includes another step of providing a transfer apparatus 25 which is positioned within the transfer chamber 23, and which further includes vertically and horizontally adjustable first and second extendible arms 131 and 132, respectively, and which are substantially vertically aligned one relative to the other, and which are operable to be pointed in the direction of the transfer port 22; and providing a loading chamber 27, which is positioned adjacent to the transfer chamber 23. The method includes another step of rotating and vertically and horizontally adjusting the first extendible arm 131 to an orientation where it is in substantial alignment with the transfer port 22; and moving the first extendible arm 131 through the transfer port 132 to pick up a processed semiconductor work piece 33 from the work piece indexing plate 70. The method of the present invention includes another step of withdrawing the first extendible arm 131 carrying the processed semiconductor work pierce, 33 from the internal cavity; and rotating the work piece indexing plate 70 1/n of a rotation. The method includes another step of rotating and vertically and horizontally adjusting the second extendible arm 132 to an orientation which is in substantial alignment with the transfer port 32; and moving the second arm 132 through the transfer port to pick up a second processed semiconductor work piece 33 from the work piece indexing plate 70. The method of unloading includes another step of withdrawing the second extendible arm 132 carrying the processed semiconductor work piece 33 from the internal cavity; and rotating and vertically and horizontally adjusting the first and second arms 131 and 132 such that they are each oriented generally in the direction of the loading chamber 27. The method includes another step of individually extending the first and second arms 131 and 132 into the loading chamber so as to deposit the processed semiconductor work pieces 33 in the loading chamber 27 and repeating the foregoing steps until all the processing stations 44 are empty.

In the methodology as described above, n is a natural number. Further, a step of providing the processing chamber 20 may include providing two or three processing chambers. In the methodology as described above, the step of providing a loading chamber 27 further comprises providing an upper portion which may receive or transfer semiconductor work pieces 33; and providing a lower portion having a cooler liner. In the methodology as described above, the loading chamber 27 may contain two to four semiconductor work pieces 33. Still further, the method includes another step of providing n pairs of transfer arms 75 which, correspond in number with the respective n processing station 44.

The present invention also includes a method for exchanging semiconductor work pieces from a semiconductor processing system 10, which includes a first step of providing a processing chamber 20 having an internal cavity 21, and which further defines a transfer port 22 which allows access to the internal cavity, and wherein the internal cavity 21 defines n processing stations 44. In the methodology as described, at least one of the processing stations 44 has a semiconductor work piece 33 which has been processed. The method includes another step of providing a semiconductor work piece indexing plate 70 which is moveably mounted within the internal cavity 21; and providing a transfer chamber 23 which is located adjacent to the transfer port 22 of the processing chamber 20. The method includes another step of providing a transfer apparatus 25 within the transfer chamber 23, and which includes vertically and horizontally adjustable first and second extendible arms 131 and 132 which are substantially vertically aligned one relative the other, and which are operable to be pointed in the direction of the transfer port 22. The method of exchanging, as described, includes another step of providing a loading chamber 27, which is positioned adjacent to the transfer chamber 23; and rotating and vertically and horizontally adjusting the first extendible arm to an orientation which is in substantial alignment with the loading chamber 27. The method also includes another step of extending the first extendible arm 131 into the loading chamber 27 to pick up an unprocessed semiconductor work piece 33, and withdrawing the first extendible arm 131 from the loading chamber; and rotating the work piece indexing plate 70 so as to position at least one processed semiconductor work piece in substantial alignment with the transfer port 22. The method of exchanging further includes another step of rotating and vertically and horizontally adjusting the second extendible arm 132 to an orientation which is in substantial alignment with the transfer port 22; and extending the second extendible arm 132 through the transfer port 22, and into the internal cavity 21 to pick up a processed semiconductor work piece 33, and withdrawing the second extendible arm 132 from the processing chamber 21. The method includes another step of rotating and vertically and horizontally adjusting the first extendible arm 131 to an orientation which is in substantial alignment with the transfer port 22; and extending the first extendible arm 131 carrying the unprocessed semiconductor work piece into the internal cavity 21, and depositing the unprocessed semiconductor work piece 33 onto the work piece indexing plate 70, and withdrawing the first extendible arm 131 from the processing chamber 20. The method includes another step of rotating and vertically and horizontally adjusting the second extendible arm to an orientation which is in substantial alignment relative to the loading chamber 27; and extending the second extendible arm into the loading chamber 27 to deposit the processed semiconductor work piece 33 in the loading chamber 27; and withdrawing the second extendible arm from the loading chamber.

The present invention provides many unexpected benefits and advantages over the prior art assemblies and methodologies utilized heretofore. Chief among these many advantages is that the arrangement of the transfer apparatus 25, and more specifically the first and second extendible arms 131 and 132, allows for vertical movement along the shaft 130. This facet of the invention further allows for the rapid and efficient movement of semiconductor work pieces 33 between the loading chamber 27, and the processing chamber 70, without any other movement of other assemblies, and in a time period which is considerably shorter than the prior art assemblies. This, of course, results in higher throughput, and lower costs to manufacture the resulting semiconductor work pieces 33. In relative comparison to other dual arm transfer apparatuses as employed in the art, it will be recognized that the prior art dual arm transfer apparatus are each oriented in substantially the same horizontal plane as compared to the present invention where the respective first and second extendible arms 131 and 132 are vertically oriented, one over the other. This arrangement allows the present invention to have a smaller footprint than other prior art assemblies, and further reduces the cost of manufacturing same.

Therefore, it will be seen that the semiconductor processing system 10; semiconductor processing chamber 20; and methodology for loading; unloading; and exchanging semiconductor work pieces 33 provides a convenient means for rapidly, conveniently, and accurately processing semiconductor work pieces 33 in a manner not possible heretofore, and which further overcomes many of the shortcomings and deficiencies noted in the prior art devices and practices which have been employed heretofore for substantially identical purposes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing system, comprising:
a plurality of processing chambers, each of which comprises a main body forming a chamber base and defining an internal cavity formed on a top surface thereof and a plurality of processing stations, each processing station located within the internal cavity, each main body comprising exhaust slots formed on the top surface thereof and each exhaust slot partially surrounding the internal cavity;
a plurality of processing pedestals, each individually received and located in a respective processing station;
each of the plurality of processing chambers further comprising a rotatable indexing plate positioned within the internal cavity, each rotatable indexing plate comprising a hub and a plurality of transfer arms and is rotatable to place the transfer arms in an orientation above the respective processing stations,
each of the plurality of processing chambers further comprising a pumping plate, each pumping plate comprising a body positioned between the chamber base and the chamber lid and within the internal cavity of each of the processing chambers, and which defines a plurality of pumping apertures which correspond in number with, and are oriented in substantially coaxially alignment relative to the respective processing stations, each of the pumping apertures positioned right above the respective pedestal, each pumping plate further defining exhaust ports which individually cooperate with the exhaust slots to transfer reaction gas from the internal cavity, through the exhaust ports, and to the exhaust slots;
each of the processing chambers further comprising a chamber lid which cooperates with the chamber base, and wherein the indexing plate and the pumping plate are positioned between the chamber base and the chamber lid;
each of the plurality of processing chambers further comprising an exhaust apparatus mounted on the chamber base, and wherein the exhaust apparatus draws the reaction gas through the exhaust ports which individually cooperate with the exhaust slots to transfer the reaction gas from the internal cavity, through the exhaust ports, and to the exhaust slots surrounding the internal cavity;
a transfer chamber defining an internal cavity and coupled with each of the processing chambers;
a plurality of loading chambers coupled with the transfer chamber, and wherein each of the loading chambers has multiple slots for placement of semiconductor work pieces, and which is operable to supply semiconductor work pieces for processing in the respective processing chambers and receive semiconductor work pieces which have been previously processed by the respective processing chambers; and
a transfer apparatus mounted in the transfer chamber, the transfer apparatus comprising a vertically oriented shaft positioned substantially centrally relative to the internal cavity and having at least two extendible arms mounted thereupon, each of the two extendible arms being individually operable to selectively move vertically and selectively move horizontally in the direction of the transfer port, and wherein the respective arms carry the individual semiconductor work pieces into, and out of the respective processing chambers, and the loading chambers in a manner so as to substantially maximize the number of semiconductor work pieces which are processed by the respective processing chambers.

2. A semiconductor processing system as claimed in claim 1, and wherein the at least two extendible arms are substantially vertically aligned when each of the arms are pointing in the direction of the transfer port.

3. A semiconductor processing system as claimed in claim 2, and wherein the at least two extendible arms rotate in a substantially horizontal plane among the transfer chamber, loading chamber and the processing chambers.

4. A semiconductor processing system as claimed in claim 2, and wherein each of the loading chambers is coupled to the transfer chamber, and wherein the respective extendible arms can be oriented so as to point at, and move towards and away from different slots and the temperature controlled plate so as to pick up a semiconductor work piece or deliver a semiconductor work piece to one of the respective slots and the temperature controlled plate.

5. A semiconductor processing system as claimed in claim 1, wherein a plurality of processing stations are located within the internal cavity of each of the processing chambers, and wherein each of the processing stations have a reaction environment.

6. A semiconductor processing system as claimed in claim 5, wherein the transfer apparatus is configured to:
   a. rotate and vertically and horizontally adjust the first extendible arm to an orientation where the first extendible arm is in substantial alignment with the transfer port;
   b. move the first extendible arm through the transfer port to pick up a processed semiconductor work piece from the work piece indexing plate;
   c. withdrawing the first extendible arm carrying the processed semiconductor work piece from the internal cavity;
   d. rotate the work piece indexing plate by 1/n of a rotation;
   e. rotate and vertically and horizontally adjust the second extendible arm to an orientation where the second extendible arm is in substantial alignment with the transfer port;
   f. move the second arm through the transfer port to pick up a second processed semiconductor work piece from the work piece indexing plate;
   g. withdraw the second extendible arm carrying the processed semiconductor work piece from the internal cavity;
   h. rotate and vertically and horizontally adjust the first and second arms so that they are each oriented generally in the direction of the loading chamber;
   i. individually extend the first and second arms into the loading chamber so as to deposit the processed semiconductor work pieces in the loading chamber; and
   j. repeat steps a-i until the n processing stations are empty.

7. A semiconductor processing system as claimed in claim 1, further comprising:
   a plurality of shower heads mounted on the chamber lid, and which are located within the internal cavity of the processing chamber, and wherein a plurality of small apertures are formed in each of the shower heads.

8. A semiconductor processing system as claimed in claim 7, wherein the respective shower heads correspond in number with, and are oriented in substantially coaxially alignment relative to the respective pumping apertures, and wherein the respective shower heads are positioned adjacent to each of the pumping apertures.

9. A semiconductor processing system as claimed in claim 8, further comprising: a plurality of heated pedestals mounted on the chamber base, and which are individually coaxially aligned relative to each of the coaxially aligned pumping apertures, and the associated shower heads, and wherein the respective heated pedestals, pumping apertures, and associated shower heads define the respective processing stations.

10. A semiconductor processing system as claimed in claim 9, wherein a semiconductor work piece to be processed is placed on one of the heated pedestals within the processing chamber, and wherein a source of a reaction gas is coupled in fluid flowing relation relative to the respective shower heads, and wherein the exhaust apparatus draws the reaction gas through the processing chamber and along a course of travel from the respective shower heads, into the respective pumping apertures, and then into contact with the semiconductor work piece being processed, and wherein the reaction gas proceeds into the slots which extend radially, and then enters into the recessed region of the chamber lid, and exits by way of radially oriented channels, and wherein the reaction gas then proceeds to pass through the exhaust ports and enter the exhaust slot formed in the chamber base, and wherein the reaction gas then travels along the exhaust passageway to the exhaust apparatus.

11. A semiconductor processing system as claimed in claim 9, wherein the heated pedestals each have a bottom surface, and wherein a source of an inert gas is supplied to the bottom surface of each of the heated pedestals so as to form an inert gas screen which prevents reaction gasses from leaking through gap between the heated pedestal and the pumping plate.

12. A semiconductor processing system as claimed in claim 1, wherein the pumping plate has a peripheral edge, and further defines a plurality of radial slots which extend radially outwardly relative to the respective pumping apertures, and wherein the respective radial slots are disposed in spaced relation one relative to the others, and wherein the spacing between the adjacent radial slots which are located near the peripheral edge of the pumping plate is the greatest.

13. A semiconductor processing system as claimed in claim 1, further comprising:
   a recessed region formed in the chamber lid, and which surrounds the respective shower heads; and
   a plurality of radially oriented channels formed in the chamber lid, and which are coupled in fluid flowing relation relative to the recessed region.

14. A semiconductor processing system as claimed in claim 1, wherein the respective exhaust ports are in fluid flowing communication with respective radially oriented channels which are formed in the chamber lid.

15. A semiconductor processing system as claimed in claim 1, wherein an exhaust slot is formed in the chamber base, and wherein the pumping plate is disposed in covering relation relative to the chamber base.

16. A semiconductor processing system as claimed in claim 15, further comprising:
   an exhaust apparatus mounted on the chamber base; and
   an exhaust passageway defined by the chamber base and which is coupled in fluid flowing relation relative to the exhaust apparatus, and further coupled in fluid flowing relation relative to the exhaust slot.

17. A semiconductor processing system as claimed in claim 1, wherein the transfer apparatus is configured to retrieve a semiconductor work piece from the loading chamber with one of the extendible arms, and then rotate this first mentioned extendible arm to the transfer port;
   retrieve a semiconductor work piece from the processing chamber with the other of the extendible arms by vertically moving this second mentioned extendible arm to an appropriate orientation, and then horizontally moving this same extendible arm through the transfer port and into the processing chamber, and then retracting the same extendible arm back through the transfer port while carrying the semiconductor work piece; and
   after the step of retrieving the semiconductor work piece, delivering another semiconductor work piece into the processing chamber with the first mentioned extendible arm by vertically moving the first mentioned extendible arm to an appropriate orientation, and then horizontally moving the first mentioned extendible arm through the transfer port and into the processing chamber.

* * * * *